United States Patent [19]

Casey et al.

[11] 4,268,848

[45] May 19, 1981

[54] PREFERRED DEVICE ORIENTATION ON INTEGRATED CIRCUITS FOR BETTER MATCHING UNDER MECHANICAL STRESS

[75] Inventors: John F. Casey, Colorado Springs, Colo.; Robert L. Vyne, Tempe, Ariz.

[73] Assignee: Motorola, Inc., Schaumburg, Ill.

[21] Appl. No.: 36,725

[22] Filed: May 7, 1979

[51] Int. Cl.³ .................... H01L 29/04; H01L 29/06; H01L 23/28

[52] U.S. Cl. ........................................ 357/60; 357/55; 357/72; 357/80; 29/580; 29/588; 29/589

[58] Field of Search ...................... 357/60, 54, 72, 55, 357/80; 29/580, 583, 588, 589

[56] References Cited

U.S. PATENT DOCUMENTS

| | | | |
|---|---|---|---|
| 3,393,088 | 7/1968 | Manasevit | 357/60 |
| 3,413,145 | 11/1968 | Robinson et al. | 357/60 |
| 3,433,684 | 3/1969 | Zanowick et al. | 357/60 |
| 3,476,991 | 11/1969 | Mize et al. | 357/60 |
| 3,603,848 | 9/1971 | Sato | 357/60 |
| 3,634,737 | 1/1972 | Maeda | 357/60 |
| 3,965,453 | 6/1976 | Seidel et al. | 357/60 |
| 3,969,753 | 7/1976 | Thorsen | 357/60 |
| 3,977,071 | 8/1976 | Jarman | 357/60 |
| 4,001,872 | 1/1977 | Khajezadeh | 357/54 |

Primary Examiner—Andrew J. James
Attorney, Agent, or Firm—Lowell E. Clark

[57] ABSTRACT

A system including in combination matched semiconductor elements in a monolithic integrated circuit together with an inexpensive encapsulation. Good electrical matching of individual components in an integrated circuit is achieved by predetermined placement and orientation of the matched components on the semiconductor element. The match is maintained through the assembly steps comprising mounting of the semiconductor element on a metallic support and subsequent encapsulation of the assembly. Best matching for devices located substantially in a {111} plane is achieved by symmetrical placement about a <211> direction.

8 Claims, 2 Drawing Figures

PREFERRED DEVICE ORIENTATION ON INTEGRATED CIRCUITS FOR BETTER MATCHING UNDER MECHANICAL STRESS

BACKGROUND AND SUMMARY OF THE INVENTION

Monolithic integrated circuits have incorporated matched devices for many years. During the evolution of the matched device technology, several design principles have become routine. For example, since semiconductor devices are temperature-sensitive, where certain components in the integrated circuit dissipate significant power desirably matched devices are located on isotherms. This is most easily effected by locating the device or devices which dissipate the most power symmetrically with respect to an axis of symmetry of the semiconductor chip containing the monolithic circuit and likewise orienting the components to be matched symmetrically about this axis. Such an approach is highly valuable in obviating another source of mismatch which arises from the stress sensitivity of semiconductor devices. The monolithic semiconductor element is generally assembled and encapsulated by the use of a material or materials which do not have exactly the same coefficient of thermal expansion as the semiconductor material itself. Thus the stress in the semiconductor die will not be equal at all points; however, when components which are desirably matched are located symmetrically with respect to a central axis of a semiconductor element with a regular shape, mismatch of electrical characteristics due to inhomogeneous stress should be minimized.

It has been traditional to mount semiconductor integrated circuits on a metallic support element by means of a hard solder eutectic bond. By choosing the metallic element to be a good match with the thermal coefficient of expansion of the silicon, the stress resulting from cool down after the attachment process is minimized. This minimizes the stress differential between components and perhaps more importantly prevents solder fatigue upon thermal cycling of the finished device. The use of plastic encapsulation may also engender inhomogeneous stress thereby causing electrical mismatch. Shifts in parameter mismatch have been found to be up to three times greater for plastic encapsulated matched devices.

Recently, the search for inexpensive encapsulation systems has led to considerations of alternatives to the thermally matched metallic mounting element and the expensive hard solders used to mount the semiconductor element thereon. In trying to achieve electrically matched devices common to a single monolithic integrated circuit encapsulated by alternative techniques, it has been found that not only is the positioning of the desirably matched elements with respect to a geometrical axis of symmetry of the semiconductor element but also the orientation of these devices with respect to the fundamental crystallographic axes of the semiconductor are important.

For silicon semiconductor elements two crystallographic orientations have been historically predominant. For devices which require epitaxial growth of a semiconductor on a single crystal semiconductor substrate, a {111} crystallographic orientation is ordinarily used, both because this orientation is favorable for epitaxial growth, the devices can be separated on natural cleavage planes, and because there are fewer problems with inhomogeneous penetration of metallic contacting means into the semiconductor element. On the other hand, a {100} orientation is most often applied in silicon MOS devices because of certain favorable device electrical characteristics which obtain by virtue of this orientation.

Regardless of the major orientation which is employed, however, generally little or no attention is given to the crystallographic orientation of the devices in the preferred plane. One exception to this general rule has been in the design of pressure transducers which often employ a bridge configuration, usually on {100} material, which exploits the difference in the piezoresistance coefficients for different directions in the plane. The published theoretical work pertaining to this problem indicates that the piezoresistance coefficient should be invariant to the position of devices made in the {111} plane. Based on these analysis one would not be led to select any particular crystallographic orientation for desirably matched devices fabricated in the {111} plane.

Two major problems are associated in the achievement of matched devices. The first of these is that the spread or standard deviation of the electrical mismatch may be so large that it is uneconomic to select only those devices having a mismatch within the desired range and discard the remainder of the devices for which there may be little or no market. Orientation of the devices along crystallographic axes which minimize their stress sensitivity could achieve reduced standard deviation and hence partially solve this yield problem. Another approach to the economic realization of matched devices is to fabricate the desirably matched component in the semiconductor wafer and then to probe the devices prior to their assembly and encapsulation in order to determine the degree of mismatch. Those devices which are unacceptable can then be marked and discarded prior to or during the assembly process. This strategy is only effective if the mismatch exhibits minimum change during the assembly and encapsulation processes.

It has been found that the first problem cited above, viz, the standard deviation of the electrical mismatch, is not substantially effected by device orientation in a {111} plane. That is, the spread is essentially independent of orientation so that there is no particular advantage to any given crystallographic orientation in terms of the potentially achievable number of devices which match within the desired tolerances. However, it has been discovered that desirably matched devices oriented with mirror symmetry about a <211> direction in a {111} plane exhibit vastly reduced changes in the mean value of the distribution when the values in wafer form are compared to those obtaining after assembly and encapsulation. The temperature coefficient of the mismatch is also greatly reduced. The shift in the mean value of the distribution is vastly enhanced for devices with non-optimal orientation for the case where the devices are mounted on a thermally mismatched supporting element. It has been traditional in the semiconductor industry to lay out individual rectilinear circuit elements parallel to one of the separation lines of the resulting die; these lines are often parallel or perpendicular to a (1$\bar{1}$0) "flat" formed on the silicon crystal from which the substrate is cut. That a statistically insignificant number of samples of the optimum orientation has been observed on silicon integrated circuit dice is imputed to accident in view of the observation of many other integrated circuit dice with disadvantageous orientations according to the present invention.

DETAILED DESCRIPTION OF THE PREFERRED EMBODIMENT

Figure 1:
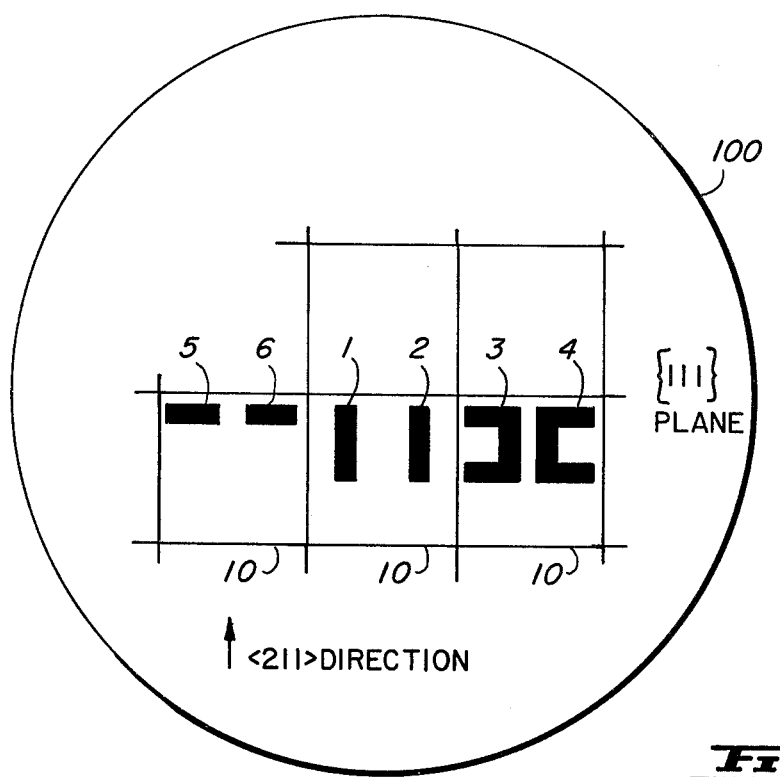
FIG. 1 is a representation of the preferred orientation of desirably matched devices with respect to the semiconductor wafer.

FIG. 1 illustrates a semiconductor substrate containing a number of individual integrated circuits showing devices therein oriented in the direction according to the invention. In FIG. 1, 100 is the semiconductor substrate which has two major faces which are substantially coincidental with a {111} plane. In this top view, the wafer 100 has a circular configuration which is as a result of utilizing semiconductor material from a pulled growth process. The shape is arbitrary and any crystal process may be used; the wafer may additionally have an orientation flat ground on its periphery to facilitate determination of the preferred direction according to this invention. The generally rectangular elements 10 are the individual integrated circuits. Internal to the integrated circuits 10 are exemplary individual component pairs 1 and 2 or 3 and 4 or 5 and 6 which are desirably matched. In this illustrative embodiment, for example, regions 1-6 may be P-type resistors in an N-type wafer. Metallic contacts to the semiconductor elements 1-4 are made near their extremities. Device pairs 1 and 2 or 3 and 4 are configured to have mirror symmetry about a <211> direction in the plane of the substrate as shown in FIG. 1. As previously explained, the devices are preferably also laid out symmetrically with respect to a geometrical axis of symmetry of each individual integrated circuit element 10.

While FIG. 1 shows simple resistors, the invention described is applicable to all majority carrier devices, and possibly to minority carrier devices as well. For example, elements 1 and 2 could be junction field effect transistors (hereinafter JFET's), with the gate structure for each device pair also having mirror symmetry about a <211> direction in the plane of the substrate. The individual integrated circuits 10 have expanded metallic regions allowing contact by probing after fabrication and subsequent to permanent contacting by means of wire bonding, etc., well-known in the art.

Figure 2:
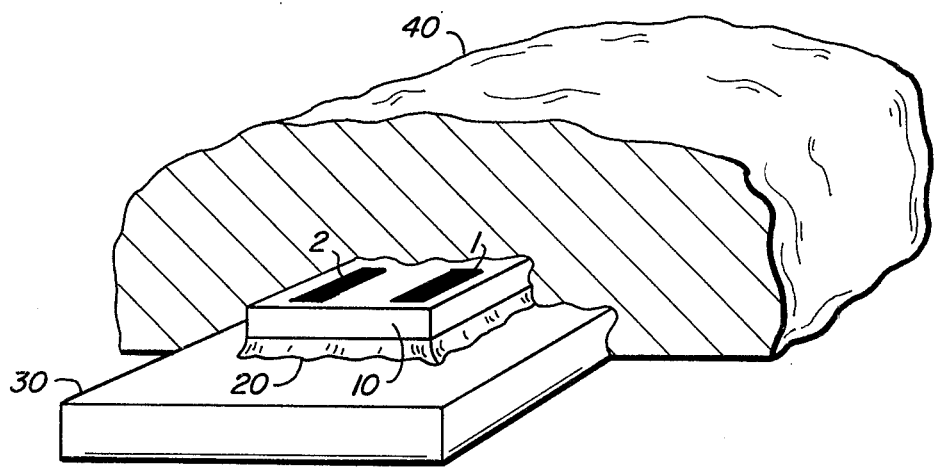
FIG. 2 is a partially assembled semiconductor device comprising the desirably oriented devices, a metallic mounting portion for the semiconductor chip and attachment being therebetween.

FIG. 2 shows one of the semiconductor integrated circuits 10 fabricated on wafer 100 in a partially assembled form. Element 30 is a substrate which allows for attachment of the die 10 so that it and its external connections may be maintained in position and suitably encapsulated. Substrate 30 may be, for example, a metallic lead frame or alternatively, another rigid material such as ceramic. Traditionally, element 30 has been made from a metal which has a thermal coefficient of expansion similar to that of the semiconductor utilized to fabricate integrated circuit 10, although such metals tend to be expensive and it is desirable to be able to use other metals without such a good thermal match to the semiconductor. The die 10 is attached to substrate 30 by means of an intermediate 20 which could be, for example, a hard or soft solder or an adhesive such as an epoxy. The epoxy could be suitably loaded in order to render it electrically conductive if electrical connection is required to the semiconductor die 10. After mounting the die 10 to substrate 30 and making the requisite electrical connections, the device is suitably encapsulated for example by welding a metallic enclosure to substrate 30, glass sealing a ceramic enclosure to a ceramic substrate 30, or surrounding both die 10 and substrate 30 with a suitable medium 40 such as an epoxy plastic (shown partially cut-away) which serves to protect the device both mechanically and to keep contaminants from reaching it. The system shown in FIG. 2 tends to induce stress in the semiconductor die 10 which can result in an electrical mismatch of the devices 1 and 2 to the extent that the stresses are not equal. As explained hereinbefore, the stress is minimized by placing devices 1 and 2 symmetrically on semiconductor die 10 and by selecting substrate 30 to have a thermal coefficient of expansion similar to that of the semiconductor. However, it has been found that when substrate 30 is not a close match to the semiconductor, or in the alternative when the device is encapsulated in plastic which is in intimate contact with semiconductor die 10, stresses are induced in the upper surfaces of die 10 which cause an electrical mismatch in devices 1 and 2.

To illustrate the improvement which is achieved by orienting devices 1 and 2 to have mirror symmetry about a <211> direction (hereinafter the <211> orientation) in a substantially {111} plane, data are presented for JFETs fabricated on semiconductor die along with other components in order to provide an integrated amplifier. Data for mirror symmetry about two crystallographic directions and a number of different assembly techniques are presented; these directions are a <211> direction shown in FIG. 1 and a <110> direction in the plane of the substrate and orthogonal to the foregoing <211> direction. The electrical parameter employed as a measurement of the degree of matching of the two devices is the input offset voltage which is that voltage which must be applied between the two devices in order to null the integrated circuit amplifier.

TABLE 1

| Parameter Distribution After Assembly With <110> Orientation of Matched Device | | |
|---|---|---|
| Assembly System | $\bar{x}$, mV | $\sigma$, mV |
| Kovar can, eutectic die bond | −2.65 | 4.22 |
| Alloy 42 substrate strip, eutectic bond, plastic encapsulation | −7.68 | 5.5 |
| Ceramic substrate, eutectic die bond | > −4.00 | >2.00 |
| Kovar can, wax die bond | 0.168 | .512 |

Table 1 shows the results of different assembly techniques for matched devices reflected about a <110> direction. Relatively good results are achieved with a Kovar can employing a eutectic die bond for mounting the integrated circuit die. Alloy 42 is a thermally matched metal used for fabricating lead frame strips suitable for plastic encapsulation. It will be seen that this system yields very poor results compared to the Kovar can system. The increased mismatch is apparently due primarily to the plastic encapsulation of the devices since the plastic itself is not a good thermal match to the silicon die. A ceramic substrate gives results intermediate to those obtained with eutectic bonding in Kovar cans or plastic. There is a systematic negative shift for all eutectic-bonded devices. If the silicon die is mounted to a Kovar can by means of wax, which is extremely compliant, excellent results are achieved. Wax, however, is not a very suitable material for use in high temperature assembly and precludes direct electrical connection to the die.

TABLE 2

Assembly-Induced Shifts From Individual Die Measurements. <110> Orientation

| Assembly System | $\bar{x}$,mV | $\sigma$,mV |
|---|---|---|
| Kovar can, eutectic die bond: | | |
| pre-assembly die probe | 1.34 | 4.67 |
| assembled devices | −2.65 | 4.22 |
| individual change in offset voltage | −3.97 | 1.38 |
| Kovar can, epoxy die bond: | | |
| pre-assembly die probe | −0.20 | 4.58 |
| assembled devices | −2.76 | 4.77 |
| individual change in offset voltage | −2.86 | 1.79 |

To illustrate the effect of the shift in offset voltage due to assembly, a number of integrated circuit die were probed in wafer form and their individually indentified offset voltages were recorded. The same devices were then checked after assembly through two different assembly processes and the results are shown in Table 2. It will be seen that, similar to the Kovar-can the values as shown for the eutectic-bonded devices in Table 1, relatively small values of offset voltage $\bar{x}$ obtain both prior to and subsequent to assembly. The spread of the distribution as shown by the $\sigma$ parameter is also not significantly affected by assembly. However, it will be seen that $\bar{x}$ exhibits large negative shifts during assembly; this is further illustrated by the third set of data which gives the shift in offset voltage ($\Delta V_{io}$) during assembly as measured on individual units. That is, approximately 4 millivolt shifts occur during assembly utilizing the eutectic die bond and a somewhat reduced shift is seen for assembly utilizing the more compliant epoxy die bond.

TABLE 3

Comparison of Device Orientation Through Assembly

| Assembly System | Orientation | Unassembled Die $\bar{x}$,mV | Unassembled Die $\sigma$,mV | Assembled Die $\bar{x}$,mV | Assembled Die $\sigma$,mV | $\Delta V_{io}$ $\bar{x}$,mV | $\Delta V_{io}$ $\sigma$,mV |
|---|---|---|---|---|---|---|---|
| Kovar cans, Eutectic Die Bonding | <110> | −1.05 | 4.27 | −4.17 | 4.92 | −3.17 | 1.95 |
| | <211> | −2.55 | 3.60 | −2.54 | 3.85 | 0.01 | 1.72 |
| Copper strip, epoxy bond, plastic package | <211> | 0.26 | 4.37 | −3.21 | 4.70 | .96 | 1.7 |

Table 3 gives the same data as Table 2 for two different orientations of the matched devices within a {111} plane and it compares three assembly systems. Comparing the two different orientations in the Kovar cans, it will be seen that there is drastically reduced assembly shift ($\Delta V_{io}$) for devices symmetrical about the <211> orientation as compared with the <110> orientation. This reduced assembly shift also obtains for the <211> devices using the plastic encapsulated alloy 42 system as well as for devices bonded to a mismatched copper lead frame and encapsulated in plastic. It may be seen from Table 3 that, as compared with the best non-wax assembly system in Table 1, suitable values of $\bar{x}$ may be achieved in utilizing an inexpensive bonding system if the <211> orientation is used. The results for plastic-encapsulated JFETs are particularly impressive when compared with the data for the <110> oriented plastic-encapsulated devices given in Table 1 which typically exhibit 7 mV $V_{io}$ shifts even with an epoxy die bond. The reduced shift from through assembly allows probing of the semiconductor circuits and wafer form so that only die which will yield suitable values of input offset voltage are assembled. Since the cost of the integrated circuit device is greatly increased by assembly as compared with the cost of the fabricated die in wafer form, it is possible to use the aforementioned preselection technique in order to manufacture inexpensive encapsulated devices.

TABLE 4

Comparison of Offset Voltage Temperature Coefficient ($TCV_{io}$) (25°-125°C.) Kovar cans, eutectic die bonding

| Orientation | $\bar{x}$,μV/°C. | $\sigma$,μV/°C. |
|---|---|---|
| <110> | 21.7 | 8.4 |
| <211> | .17 | 11.7 |

Table 4 shows data for another important characteristic of matched devices which is the temperature coefficient of the input offset voltage. For the same assembly system, in this case Kovar cans, the temperature coefficient is drastically reduced using the <211> orientation; as before, the spread (as shown by the $\sigma$ data) is not appreciably affected.

From these data, one concludes that the best results in terms of yield of suitably matched devices may be achieved by using a combination of the proper orientation symmetrical about a <211> direction and a compliant bonding medium. For definitional purposes, a compliant bonding medium is one having substantially less rigidity than the typical eutectic solders conventionally employed in the bonding of the semiconductor die to its supporting substrate. Thus, the proper orientation and compliant bonding allows integrated circuit fabrication in plastic encapsulated lead frames such as copper having a substantially different thermal coefficient of expansion from silicon. In the experiments described above, the compliant medium employed was Amicon CT4042, a two-component silver-loaded epoxy; however the data for the wax die bonded units show that a large range of materials may be used. Similarly, inexpensive materials other than copper may be employed for the supporting means for the integrated circuit die even though such materials may have a substantially different thermal coefficient of expansion than silicon.

We claim:

1. A monolithic semiconductor element comprising a silicon die with first and second major surfaces parallel with a substantially {111} plane; at least two majority carrier devices, said devices having mirror symmetry about a <211> direction in said substantially {111} plane; a supporting substrate for said die; and compliant mounting means for attaching said die to such supporting substrate, whereby approximate matching of characteristics of said devices is preserved despite thermal-mechanical stress associated with fabrication, handling, test, and use.

2. The element of claim 1 where said mounting means comprise epoxy.

3. The element of claims 1 or 2 where said supporting substrate comprise a metal having a thermal coefficient of expansion substantially different from silicon.

4. The element of claim 1 wherein the combination of said die, said compliant mounting means and said substrate are substantially surrounded by a plastic encapsulant.

5. The element of claim 4, wherein said compliant mounting means comprises epoxy.

6. The element of claim 4 or 5 where said supporting means comprises a metal having a thermal coefficient of expansion substantially different from silicon.

7. A method for manufacturing a monolithic semiconductor element having at least a pair of approximately matched majority carrier devices comprising:

providing a silicon substrate having first and second major faces lying substantially parallel to a {111} plane;

forming a plurality of said pair of approximately matched devices in one major surface of said substrate so that each of said pair of devices exhibit mirror symmetry about a <211> direction in said substantially {111} plane;

forming individual integrated circuits by separating said silicon substrate into a plurality of die each containing at least a pair of approximately matched devices;

providing a supporting substrate for at least one of said die; and mounting said die on said supporting substrate with compliant mounting means; whereby approximate matching of said device characteristics is preserved despite thermal-mechanical stress associated with fabrication, handling, test, and use.

8. The method of claim 7 further including:

electrically testing said plurality of said device pair prior to said separating; and assembling only dice comprising a device pair meeting a predetermined electrical match specification.

* * * * *